US006972476B2

(12) United States Patent
Chen et al.

(10) Patent No.: US 6,972,476 B2
(45) Date of Patent: Dec. 6, 2005

(54) DIODE AND DIODE STRING STRUCTURE

(75) Inventors: Shiao-Shien Chen, Hsinchu (TW); Tung-Yang Chen, Hsinchu (TW); Tien-Hao Tang, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/712,236

(22) Filed: Nov. 12, 2003

(65) Prior Publication Data

US 2005/0098847 A1 May 12, 2005

(51) Int. Cl.[7] ...................... H01L 29/00; H01L 27/112; H01L 31/075

(52) U.S. Cl. ...................... 257/547; 257/544; 257/656; 257/910

(58) Field of Search ................................ 257/544–547, 257/355, 371, 109, 112, 122, 162, 121, 601, 257/656, 548, 910; 361/56, 91.5

(56) References Cited

U.S. PATENT DOCUMENTS 5,181,091 A * 1/1993 Harrington et al. ......... 257/355
5,432,368 A * 7/1995 Jimenez ...................... 257/355
5,798,560 A * 8/1998 Ohkawa et al. ............. 257/555
5,815,026 A * 9/1998 Santin et al. ............... 327/536

FOREIGN PATENT DOCUMENTS

JP 06104459 A * 4/1994 ........... H01L 29/91
TW 390013 A * 5/2000 ......... H01L 21/339

* cited by examiner

*Primary Examiner*—Shouxiang Hu
(74) *Attorney, Agent, or Firm*—J.C. Patents

(57) ABSTRACT

A diode structure is provided. The diode structure comprises a first conductive type substrate, a second conductive type first well region, a first conductive type second well region, a second conductive type first doped region, a first conductive type second doped region and a second conductive type third doped region. The first well region is located within the substrate and the second well region is located within the first well region. The first doped region is located within the first well region and detached from the second well region but adjacent to the surface of the substrate. The second doped region and the third doped region are located within the second well region and adjacent to the surface of the substrate. The second doped region is located between the first doped region and the third doped region but detached from both the first doped region and the third doped region.

5 Claims, 6 Drawing Sheets

DIODE AND DIODE STRING STRUCTURE

BACKGROUND OF THE INVENTION

1. Field of the Invention

The present invention relates to a semiconductor device structure. More particularly, the present invention relates to a diode and a diode string structure.

2. Description of the Related Art

Diode is at present one of the most fundamental constituent devices in electronic systems. Each diode has properties that resemble a switch and may serve as a rectifier. Therefore, a diode plays an important role in the electronic systems. Typically, a diode comprises a PN junction formed by joining a block of P-type semiconductor with a block of N-type semiconductor. In practice, the PN junction of a diode are formed in a single silicon crystal substrate by implanting different types of dopants in adjacent areas of a mono-crystalline silicon chip.

The applications of diodes range from simple to very complex. Current rectification of most home electrical appliances often relies on the special properties of a diode. Because a diode operating in a forward bias condition has a good electrostatic discharge protection capability, the use of diodes in electrostatic discharge (ESD) protection devices is quite common too.

Sometimes, one or more diodes are serially connected together to form a diode string that facilitates device operation. Such diode strings are common deployed in integrated circuit (IC) circuit design. Basically, a voltage drop is set up in a circuit when the diode string is turned on in a forward bias condition.

FIG. 1 is a schematic cross-sectional view showing the structure of a conventional diode string. As shown in FIG. 1, the structure comprises a P-type substrate 100, a plurality of N-type well regions 102, a plurality of $p^+$ doped regions 104, a plurality of $n^+$ doped regions 106 and a plurality of shallow trench isolation (STI) regions 107.

The N-type well regions 102 are located within the P-type substrate 100. Furthermore, each N-type well region 102 has a $p^+$ doped region 104 and an $n^+$ doped region 106. The N-type well region 102, the $p^+$ doped region 104 and the $n^+$ doped region 106 together form a single diode structure 103. The shallow trench isolation regions 107 are positioned between neighboring $p^+$ doped region 104 and $n^+$ doped region 106.

The $n^+$ doped region 106 of each diode structure 103 is coupled to the $p^+$ doped region 104 of the following diode structure 103. Furthermore, the $p^+$ doped region 104 at the first diode in the diode string is coupled to a drain terminal 108 and the $n^+$ doped region 106 at the last diode in the diode string is coupled to a ground terminal 110.

However, some problems immediately arise when a voltage is applied to the drain terminal of the aforementioned diode string. Firstly, a parasitic PNP bipolar junction transistor 112 is present in the substrate 100 of the diode string. Because the emitter (the $p^+$ doped region 104) and the collector (the p-type substrate 100) conduct when the emitter (the $p^+$ doped region 104) and the base (the $n^+$ doped region 106) of the parasitic PNP bipolar junction transistor conduct, a leakage current is produced. Consequently, the turn on voltage of the diode string will not increase in proportional to the number of diodes used. Moreover, the current leak problem will intensify as the number of diodes in each diode string is increased. As a result, the performance of the diode string inside an electrostatic discharge protection device or an electronic circuit or its performance as a rectifier or a switch is very much affected. To compensate for the leakage current problem, more diodes must be used to reach pre-determined turn on voltage. Yet, stringing more diodes together directly increases the area occupied by the diode string structure. Hence, some of our efforts aiming at miniaturizing devices have been annulled.

SUMMARY OF THE INVENTION

Accordingly, at least one object of the present invention is to provide a diode and a diode string structure that can minimize leakage current flowing from a triggered diode due to the presence of a parasitic bipolar junction transistor in a conventional diode string.

At least a second object of this invention is to provide a diode string structure that can minimize the disproportionate increase in turn on voltage with an increase in the number of diodes in a diode string due to the presence of leakage current in conventional diodes.

At least a third object of this invention is to provide a diode string structure that can minimize the number of diodes in a diode string to reach a pre-determined turn on voltage. Thus, the area that is occupied by the diode string structure in a circuit design is reduced.

At least a fourth object of this invention is to provide a string diode structure having bidirectional conduction capability that can simplify the design of electrostatic discharge protection circuits and reduce area occupation of the electrostatic discharge protection device.

To achieve these and other advantages and in accordance with the purpose of the invention, as embodied and broadly described herein, the invention provides a diode structure. The diode structure comprises a first conductive type substrate, a second conductive type first well region, a first conductive type second well region, a second conductive type first doped region, a first conductive type second doped region and a second conductive type third doped region. The first well region is located within the substrate and the second well region is located within the first well region. The first doped region is located within the first well region and not physically contacted with the second well region but adjacent to the surface of the substrate. Furthermore, the second doped region and the third doped region are located within the second well region and adjacent to the surface of the substrate. The second doped region is located between the first doped region and the third doped region but not physically contacted with the first doped region and the third doped region. The first doped region and the second doped region are coupled to a drain terminal and the third doped region is coupled to a ground terminal.

This invention also provides a diode string structure. The diode string structure comprises a first conductive type substrate, at least two diode structures and a first shallow trench isolation (STI) region. Furthermore, each diode structure comprises a second conductive type first well region, a first conductive type second well region, a second conductive type first doped region, a first conductive type second doped region and a second conductive type third doped region. The diode structures are located within the substrate. The first well region of each diode structure is located within the substrate and the second well region is located within the first well region. The first doped region is located within the first well region and not physically contacted with the second well region but adjacent to the surface of the substrate. Furthermore, the second doped region and the third doped region are located within the second well region and adjacent to the surface of the substrate. The second doped region is located between the first doped region and the third doped region but not physically contacted with the first doped region and the third doped region. The first shallow trench isolation structure is located between neighboring diode structures and adjacent to the surface of the substrate. In addition, the third doped region of each diode structure is coupled to the first doped region and the second doped region of the following diode structure.

This invention also provides an alternative diode string structure. The diode string structure comprises a first conductive type substrate, a second conductive type first well region, at least two diode structures, a second conductive type first doped region and a first shallow trench isolation region. Each diode structure comprises a first conductive type second well region, a first conductive type second doped region and a second conductive type third doped region. The first well region is located within the substrate. The diode structure is located within the first well region and the second well region of the diode structure is located within the first well region. Furthermore, the second doped region and the third doped region are located within the second well region and adjacent to the surface of the substrate but the second doped region and the third doped region are not physically contacted with each other. Moreover, the first doped region is located within the first well region at the starting terminal of the diode string structure and not physically contacted with the second well region but adjacent to the surface of the substrate. In addition, the first shallow trench isolation region is located between neighboring diode structures and adjacent to the surface of the substrate. The third doped region of each diode structure is coupled to the second doped region of a later stage diode structure.

Although a parasitic bipolar junction transistor still exists within the diode and diode string structure, a direct conduction between the emitter and the base of the parasitic bipolar junction transistor is prevented because the base (the first doped region) is at a higher voltage (or at the same voltage) than the emitter (the second doped region). As a result, the emitter (the second doped region) and the collector (the substrate) of the parasitic bipolar junction transistor no longer conduct to produce a large leakage current as in a conventional diode string.

Unlike a conventional diode string with a unidirectional conduction property (no conduction through the diodes when a reverse bias voltage is applied), the diode structure according to this invention operates bidirectionally. This is because the substrate and the first well region together form another diode structure with a PN junction opposite to the PN junction of the diode formed by joining the second doped region and the third doped region together. Consequently, the substrate and the first well region conduct as soon as a reverse bias voltage is applied to the diode because the substrate and the first well region form a diode with a reverse conduction direction.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
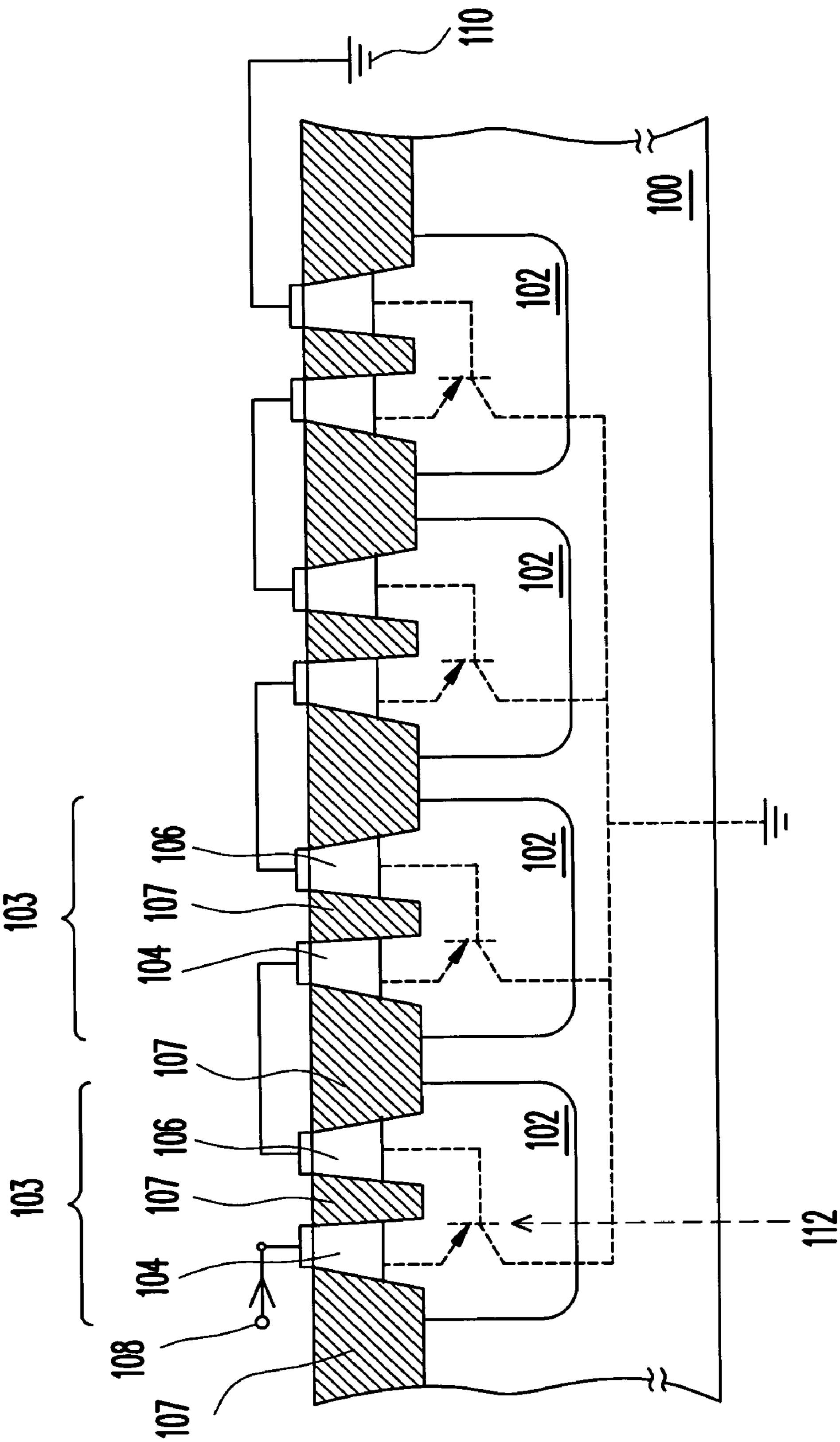
FIG. 1 is a schematic cross-sectional view showing the structure of a conventional diode string.

Reference will now be made in detail to the present preferred embodiments of the invention, examples of which are illustrated in the accompanying drawings. Wherever possible, the same reference numbers are used in the drawings and the description to refer to the same or like parts.

Figure 2:
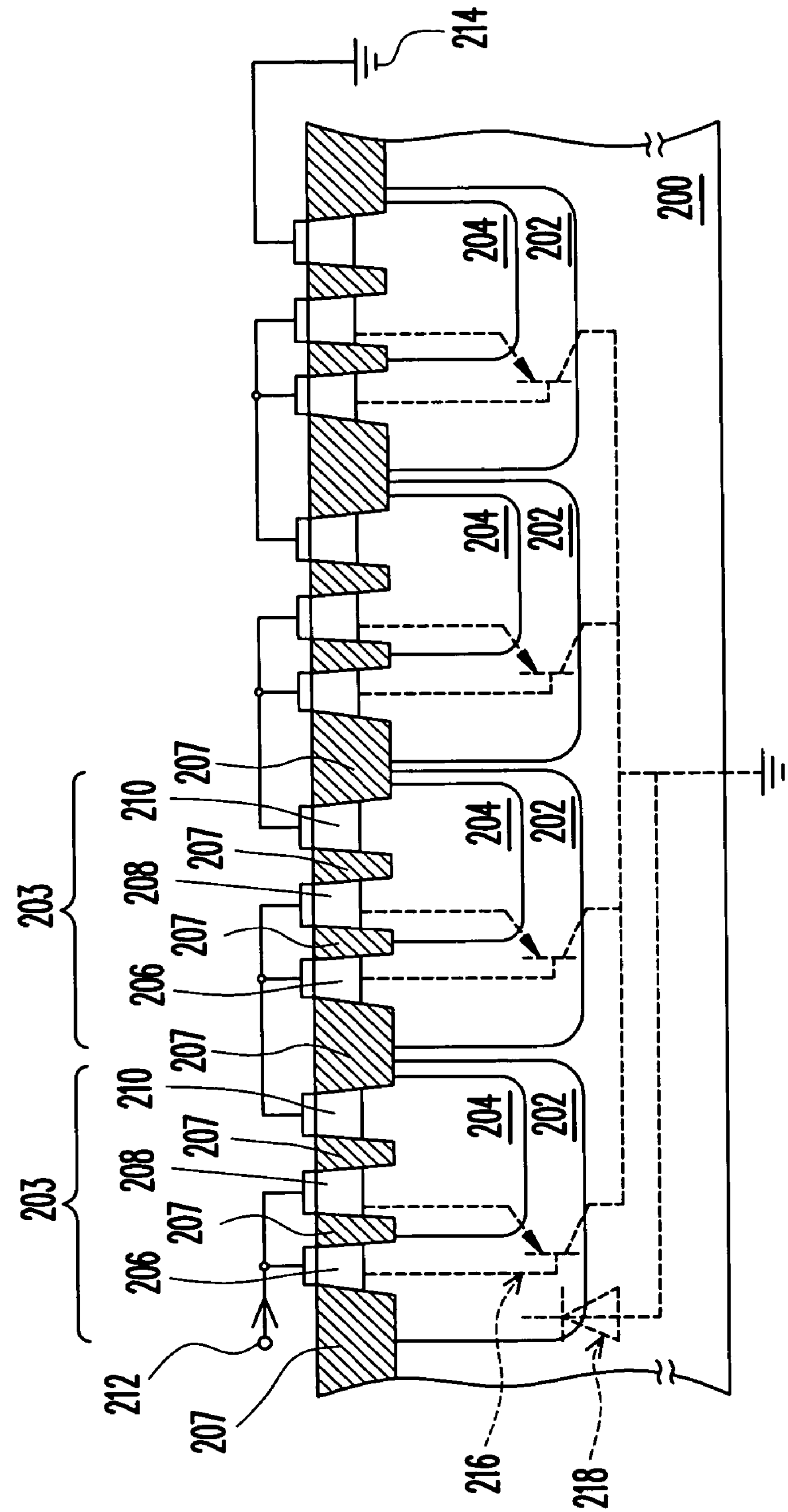
FIG. 2 is a schematic cross-sectional view showing the structure of a diode string according to a first preferred embodiment of this invention.

FIG. 2 is a schematic cross-sectional view showing the structure of a diode string according to a first preferred embodiment of this invention. As shown in FIG. 2, the diode string has a triple well structure and is comprised of a plurality of diode structures 203. The diode string structure comprises a first conductive type substrate 200, a plurality of diode structures 203 and a plurality of shallow trench isolation (STI) structures 207. Each diode structure 203 further comprises a second conductive type well region 202, a first conductive type well region 204, a second conductive type doped region 206, a first conductive type doped region 208 and a second conductive type doped region 210. The first conductive type substrate 200 is a p-doped substrate, for example.

The diode structures 203 are located within the substrate 200. The second conductive type well region 202 of each diode structure 203 is located within the substrate 200. The second conductive well region 202 is an n-doped well, for example. The first conductive type well region 204 is located within the second conductive type well region 202. The first conductive type well region 204 is a p-doped well, for example.

The second conductive type doped region 206 is located within the second conductive type well region 202 and not physically contacted with the first conductive type well region 204 but adjacent to the surface of the substrate 200. The second conductive type doped region 206 is an $n^+$ doped region, for example.

The first conductive type doped region 208 and the second conductive type doped region 210 are located within the first conductive type well region 204. The two doped regions (208 and 210) are adjacent to the surface of the substrate 200. Furthermore, the first conductive type doped region 208 is located between the second conductive type doped regions 206 and 210 but not physically contacted with them. The first conductive type doped region 208 is a $p^+$ doped region and the second conductive type doped region 210 is a $n^+$ doped region, for example.

The shallow trench isolation regions 207 are located between neighboring diode structures 203 and neighboring doped regions (206, 208 and 210) adjacent to the surface of the substrate 200.

In addition, various diodes 203 within the substrate 200 are coupled together as follows. First, the second conductive type doped region 210 of each diode structure 203 is coupled to the second conductive type doped region 206 and the first conductive type doped region 208 of a later diode structure 203. If a diode 203 is the first diode of the diode string, the second conductive type doped region 206 and the first conductive type doped region 208 are coupled to a drain terminal 212 (a power supply terminal). Meanwhile, the second conductive type doped region 210 of the diode 203 is coupled to the second conductive type doped region 206 and the first conductive type doped region 208 of the following diode 203. If a diode 203 is the last diode of the diode string, the second conductive type doped region 210 is coupled to a ground terminal 214. Meanwhile, the second conductive type doped region 206 and the first conductive type doped region 208 of the diode 203 is coupled to the second conductive type doped region 210 of the previous diode 203.

Note that the second conductive type doped region 210 of each diode 203 is coupled to the second conductive type doped region 206 and the first conductive type doped region 208 of the following diode 203. With this setup, since, in the same diode 203, the second conductive type doped region 206 is voltage equivalent to the first conductive type doped region 208, a parasitic bipolar junction transistor 216, constructed by the emitter (the first conductive type doped region 208), the collector (the substrate 200) and the base (the second conductive type doped region 206), within the substrate 200 is turned off. Hence, conduction between the emitter (the first conductive type doped region 208) and the collector (the substrate 200) of the parasitic bipolar junction transistor 216 is also prevented thereby resolving the current leak problem of conventional diodes.

Furthermore, the substrate 200 and the second conductive type well region 202 together constitute another diode structure with a PN junction complementary to the PN junction formed by the first conductive type doped region 208 and the second conductive type doped region 210. Consequently, the diode string of this invention is able to conduct in the reverse direction because the substrate 200 and the second conductive type well region 202 forms a diode 218 that can conduct in the opposite direction. In other words, the diode structure according to this invention conducts bidirectionally rather than unidirectionally like a conventional diode string (being conductive in one direction and non-conductive when a reverse bias voltage is applied, that is, a unidirectional conduction structure).

Figure 3:
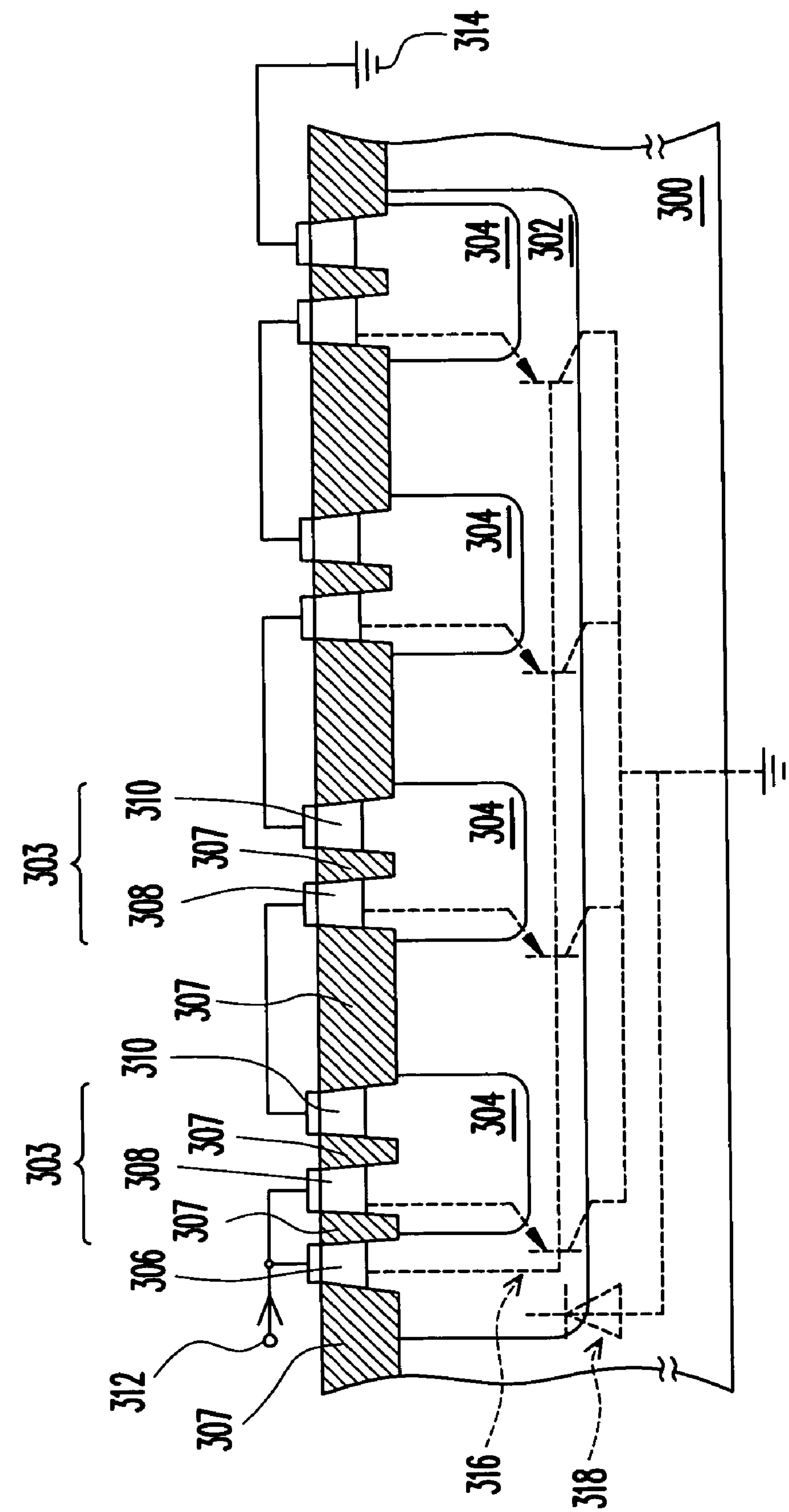
FIG. 3 is a schematic cross-sectional view showing the structure of a diode string according to a second preferred embodiment of this invention.

FIG. 3 is a schematic cross-sectional view showing the structure of a diode string according to a second preferred embodiment of this invention. As shown in FIG. 3, the diode structure also has a triple well structure and is comprised of a plurality of diode structures 303. The diode string structure comprises a first conductive type substrate 300, a second conductive type well region 302, a plurality of diode structures 303, a second conductive type doped region 306 and a plurality of shallow trench isolation (STI) regions 307. Furthermore, each diode structure 303 comprises a first conductive type well region 304, a first conductive type doped region 308 and a second conductive type doped region 310.

The first conductive type substrate 300 is a p-doped substrate, for example. The second conductive type well region 302 is located within the substrate 300. The second conductive type well region 302 is an n-doped well, for example.

The diode structures 303 are located within the second conductive type well region 302. The first conductive type well region 304 of each diode structure 303 is located within the second conductive type well region 302. The first conductive type well region 304 is a p-doped well, for example.

The first conductive type doped region 308 and the second conductive type doped region 310 are located within the first conductive type well region 304. The two doped regions 308 and 310 are adjacent to the surface of the substrate 300 but not physically contacted with each other. The first conductive type doped region 308 is a $p^+$ doped region and the second conductive type doped region 310 is an $n^+$ doped region, for example.

The second conductive type doped region 306 is located within the second conductive type well region 302 at the starting terminal of the diode string. The second conductive type doped region 306 is adjacent to the surface of the substrate 300 but not physically contacted with the first conductive type well region 304. The second conductive type doped region 306 is a $n^+$ doped region, for example.

The shallow trench isolation regions 307 are located between neighboring diode structures 303 and neighboring doped regions (306, 308 and 310) adjacent to the surface of the substrate 300.

In addition, various diodes 303 within the substrate 300 are coupled together as follows. First, the second conductive type doped region 310 of each diode structure 303 is coupled to the first conductive type doped region 308 of the following diode structure 303. If a diode 303 is the first diode of the diode string, the first conductive type doped region 308 of the diode 303 is coupled to a drain terminal 312 (a power supply terminal). Meanwhile, the second conductive type doped region 310 of the diode 303 is coupled to the first conductive type doped region 308 of the following diode 203. For a diode 203 is the last diode of the diode string, the second conductive type doped region 310 is coupled to a ground terminal 314. Meanwhile, the first conductive type doped region 308 of the diode 303 is coupled to the second conductive type doped region 310 of a previous diode 203.

Note that the diode structure according to this invention still includes a parasitic bipolar junction transistor 316 within the substrate 300. However, the base (the second conductive type doped region 306) is at a voltage higher than (or equal to) the emitter (the first conductive type doped region 308). Therefore, the parasitic bipolar junction transistor 316 possesses the base, the collector and the emitter is turned off. Hence, conduction between the emitter (the first conductive type doped region 308) and the collector (the substrate 300) of the parasitic bipolar junction transistor 316 is also prevented thereby resolving the current leak problem of conventional diodes.

Furthermore, the substrate 300 and the second conductive type well region 302 together constitute another diode structure with a PN junction complementary to the PN junction formed by the first conductive type doped region 308 and the second conductive type doped region 310. Consequently, the diode string of this invention is able to conduct in the reverse direction because the substrate 300 and the second conductive type well region 302 form a diode 318 that can conduct in the opposite direction. In other words, the diode structure according to this invention conducts bidirectionally rather than unidirectionally like a conventional diode string (being conductive in one direction and non-conductive when a reverse bias voltage is applied, that is, a unidirectional conduction structure).

In addition, all the diodes in a diode string are set up inside a common second conductive type well region 302 within the substrate 300 so that the current leak problem for a conventional diode is resolved. Moreover, a single conductive type doped region 306 is required because each diode can use the same second conductive type doped region 306. As a result, area within the substrate for accommodating the diode string is greatly reduced.

To verify the reduction of leakage current, an experiment measuring the current flowing through a diode or a diode string and associated leakage current flowing to the substrate is measured after applying an external voltage to the terminals of a single diode or a diode string.

Figure 4:
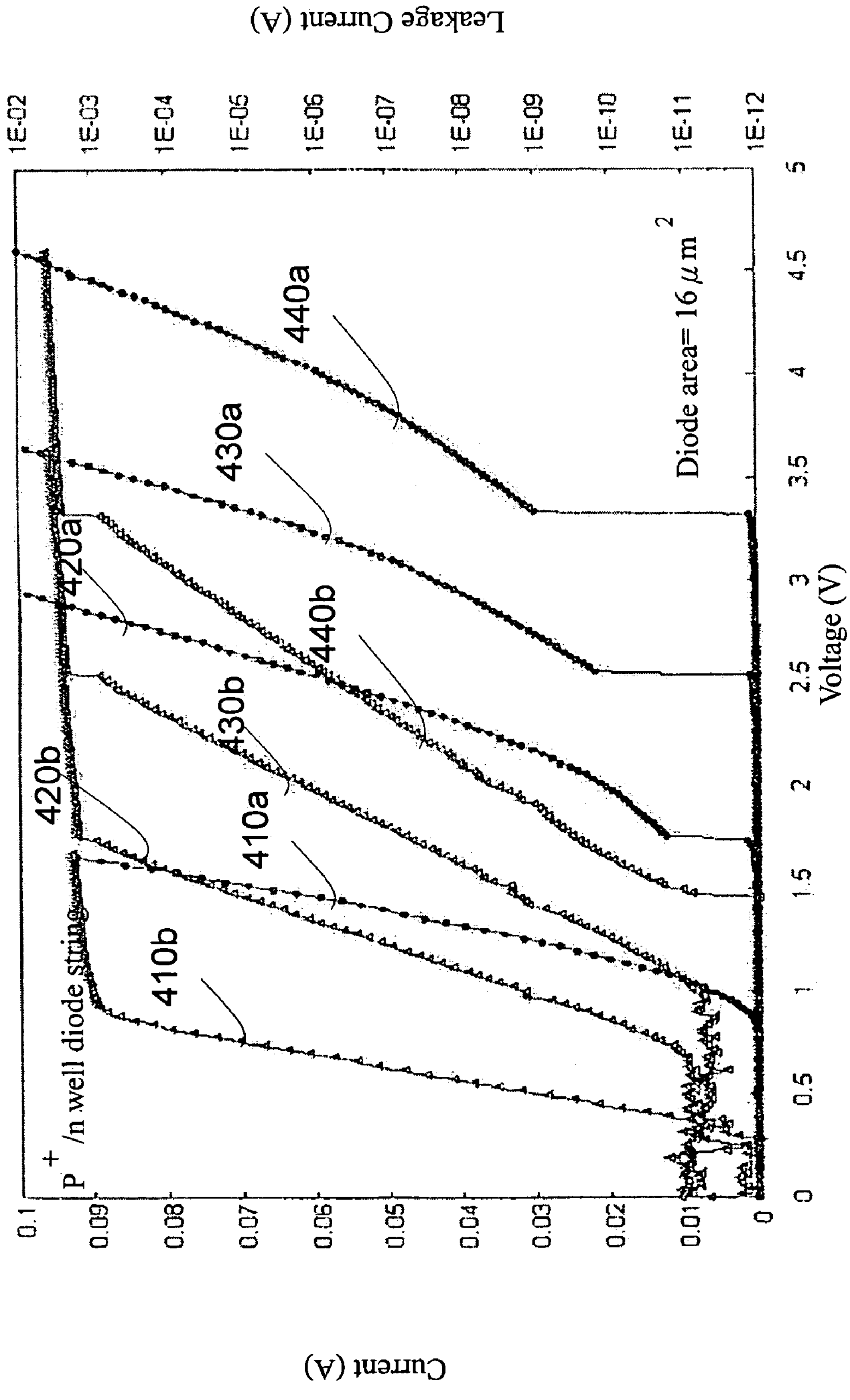
FIG. 4 is a graph showing the relationship between an externally applied voltage to a conventional diode (string) structure and the subsequently measured current and leaked current.
Figure 5:
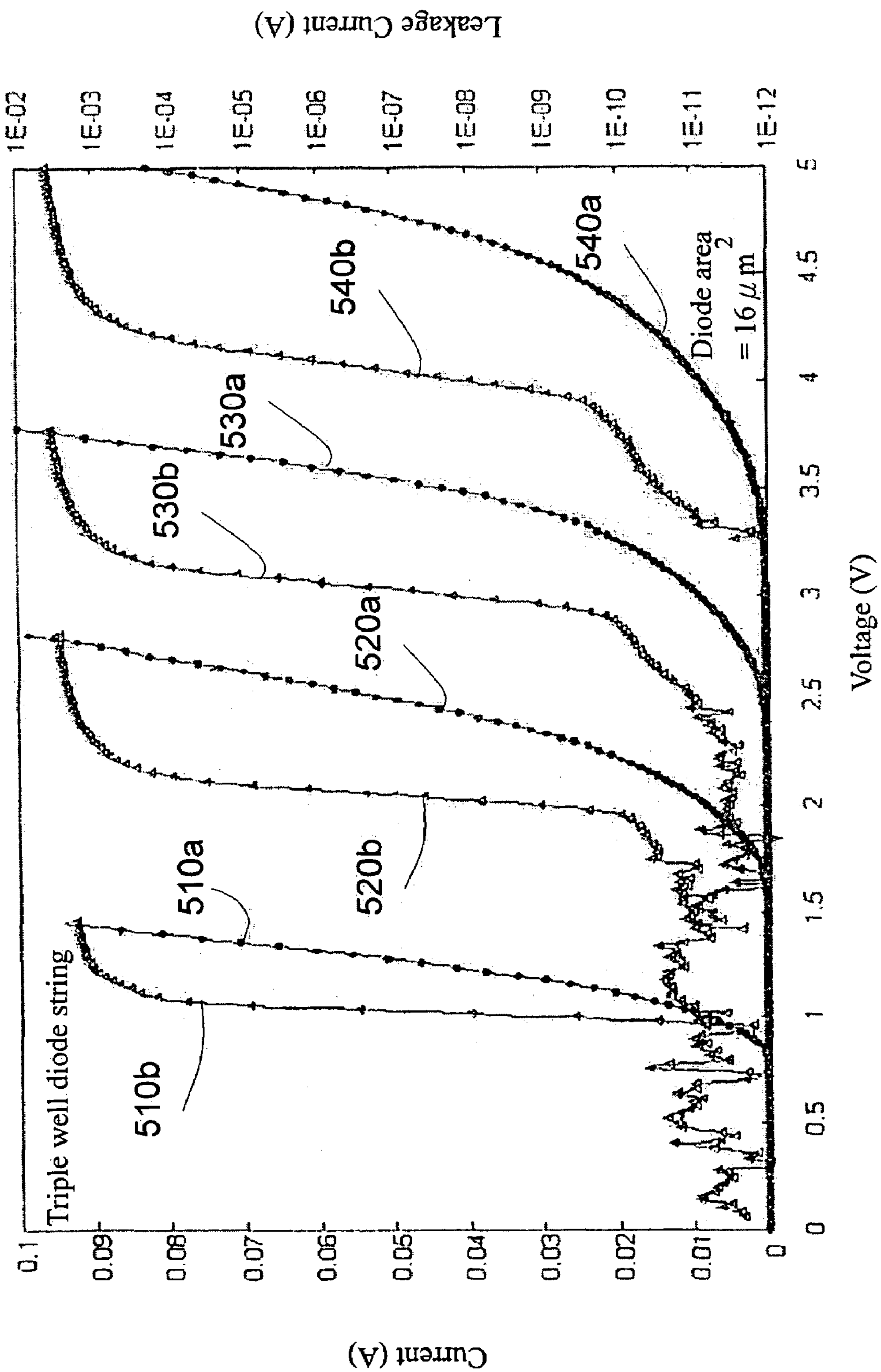
FIG. 5 is a graph showing the relationship between an externally applied voltage to a diode (string) structure according to this invention and the subsequently measured current and leaked current.

FIGS. 4 and 5 are graphs showing the measured current and leakage current when an external voltage is applied to a diode. The horizontal axis represents the external voltage (V) applied, the vertical axis on the left side represents the measured current (in amperes) and the vertical axis on the right side represents the measured leakage current (in amperes). Furthermore, the curves 410*a*, 420*a*, 430*a* and 440*a* in FIG. 4 and the curves 510*a*, 520*a*, 530*a* and 540*a* in FIG. 5 are voltage versus current relationship for a diode string having from one to four diodes respectively. Similarly, the curves 410*b*, 420*b*, 430*b* and 440*b* in FIG. 4 and the curves 510*b*, 520*b*, 530*b* and 540*b* in FIG. 5 are voltage versus leakage current relationship for a diode string having from one to four diodes respectively.

The graph in FIG. 4 shows the measured current and leakage current of a conventional diode (or diode string) with $p^+$/n well region. According to the curves 410*a*, 420*a*, 430*a* and 440*a*, the turn on voltage increases as the number of diodes in a diode string increases. Hence, a larger external voltage is required to drive the diode structure. However, according to the curves 410*b*, 420*b*, 430*b* and 440*b*, the leakage current increases considerably as the number of diodes in a diode string increases. For example, a diode string with four diodes demands an externally supplied voltage of greater than 3.3V to drive the device (the curve 440*a*). Yet, leakage current starts to appear when the applied voltage reaches about 1.4V and increases with the applied external voltage thereafter.

The graph in FIG. 5 shows the measured current and leakage current of a diode (or diode string) with a triple well configuration according to this invention. According to the curves 510*a*, 520*a*, 530*a* and 540*a*, the turn on voltage increases as the number of diodes in a diode string increases. Hence, a larger external voltage is required to drive the diode structure. However, according to the curves 510*b*, 520*b*, 530*b* and 540*b*, the leakage current condition of the diode string improves considerably over that of the conventional diode string. For example, a diode string with four diodes demands an externally supplied voltage of greater than 3.5V to drive the device (the curve 540*a*). Yet, leakage current starts to appear when the applied voltage reaches about 3.4V. Thus, the diode string structure according to this invention not only can reduce the leakage current but also can really amplify the turn on voltage by stringing more diodes together.

Figure 6:
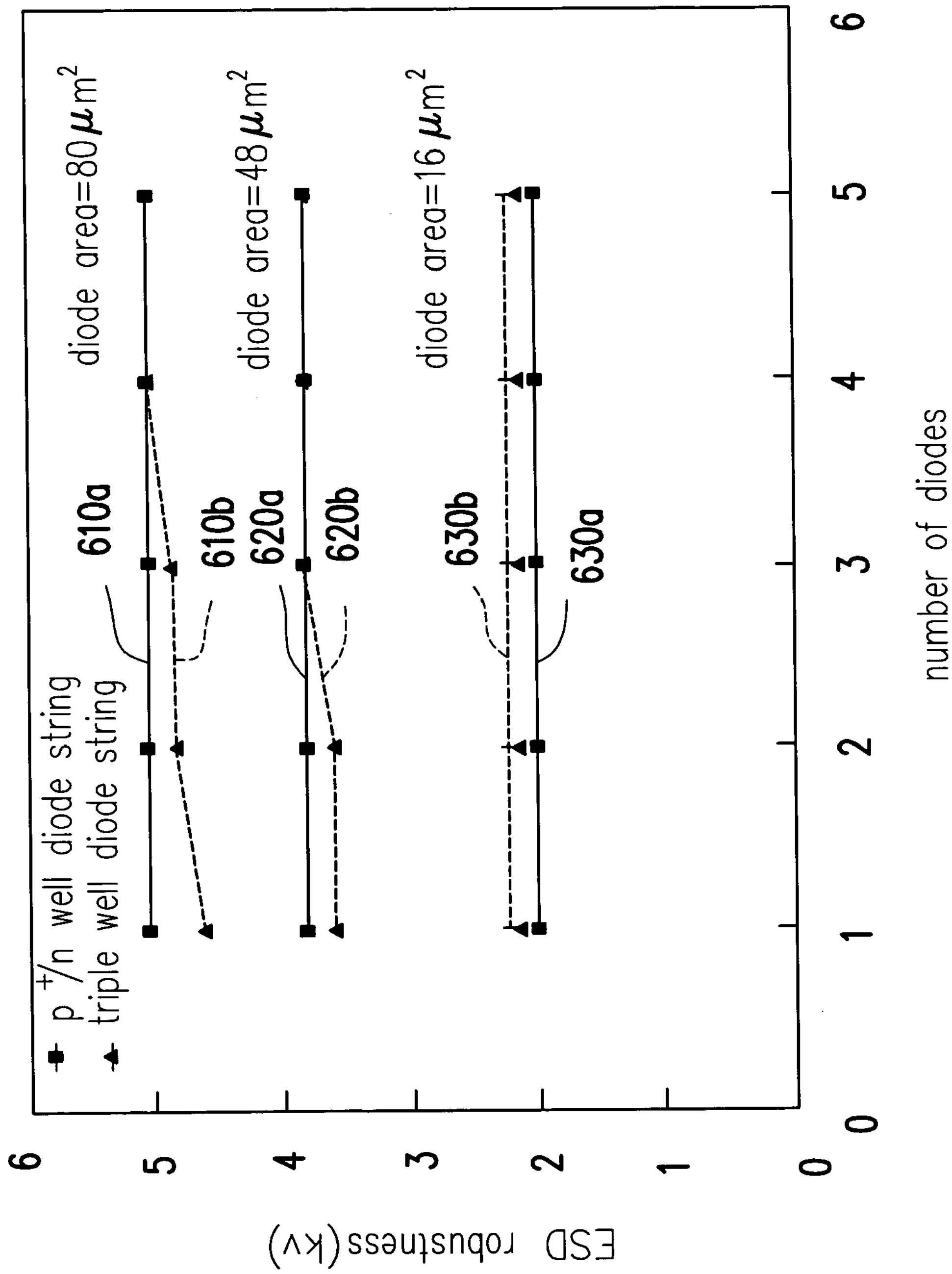
FIG. 6 is a graph showing the variation of robustness of electrostatic discharge protection with the number of diodes in a diode string for different diode areas.

FIG. 6 is a graph showing the variation of robustness of electrostatic discharge protection with the number of diodes in a diode string for different diode areas. In FIG. 6, curves 610*a* and 610*b* shows the relationship between the robustness of ESD protection devices and the number of diodes in a diode string with a diode area of 80 $\mu m^2$. Similarly, curves 620*a* and 620*b* shows the relationship between the robustness of ESD protection devices and the number of diodes with a diode area of 48 $\mu m^2$ and curves 630*a* and 630*b* show the relationship between the robustness of ESD protection devices and the number of diodes with a diode area of 16 $\mu m^2$. Furthermore, the curves 610*a*, 620*a* and 630*a* show the measured robustness of an ESD protection device constructed from a string of diodes having a conventional $p^+$/n well design. On the other hand, the curves 610*b*, 620*b* and 630*b* show the measured robustness of an ESD protection device constructed from a string of diodes having a triple well design according to this invention.

As shown in FIG. 6, both the conventional diode structure and the diode structure according to this invention have similar robustness in ESD protection for the same diode area. Thus, this invention not only solves the leakage problem of a conventional diode but also provides an ESD protection almost identical to a conventional ESD protection device.

In summary, major advantages of this invention at least includes:

1. Although the triple well diode (diode string) design of this invention also includes a parasitic bipolar junction transistor, the parasitic bipolar junction transistor will not conduct or leak. Hence, the problem of having a leakage current in the diode structure even before the diodes are turned on is resolved.
2. Because a leakage current no longer flow before the diodes are turned on, the turn on voltage of a diode string will increase in proportional to the number of diodes used in a diode string.
3. Because the turn on voltage of a diode string is strictly proportional to the number of diodes used, a smaller number of diodes can be string together to produce a desired turn on voltage. In other words, the areas reserved for accommodating a diode string structure can be reduced.
4. Because the diode string of this invention can conduct bidirectionally, there is no need to set up an additional diode structure to accommodate a reverse bias voltage as in a conventional diode design. Hence, a simpler circuit can be produced and the area for accommodating the ESD protection device is greatly reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A diode string structure, comprising:

a substrate of a first conductive type;

a diode string having a starting end and a terminal end on the substrate;

a first well region of a second conductive type located within the substrate;

a first doped region of the second conductive type located within the first well region, wherein the first doped region is heavily doped and forms the starting end of the diode string and adjacent to the surface of the substrate, and the first doped region is coupled to a drain terminal; and at least two diode structures located within the first well region, wherein one of the diode structures is a starting diode structure adjacent to the starting end of the diode string, one of the diode structure is an ending diode structure forming the terminal end of the diode string, and each of the diode structures comprises:

a second well region with the first conductive type located within the first well region, wherein the second well region is not in direct contact with the first doped region; and a second doped region of the first conductive type and a third doped region of the second conductive type located within the second well region and adjacent to the surface of the substrate, wherein the third doped region and the second doped region are each heavily doped and are not in direct contact with each other, wherein shallow trench isolations regions are formed adjacent to the surface of the substrate, so as to respectively separate immediately neighboring regions of said first, second and third regions.

2. The diode string structure of claim 1, wherein for each of additional diode structures between the starting diode structure and the ending diode structure in the diode string, there is a post diode structure in the diode string directly located next to said each of the additional diode structures, and the third doped region of said each of the additional diode structures is coupled to the second doped region of the post diode structure.

3. The diode string structure of claim 2, wherein the second doped region of the starting diode structure is coupled to the first doped region and the third doped region of the starting diode structure is coupled to the second doped region of one of the additional diode structures next to the starting diode structure in the diode string.

4. The diode string structure of claim 2, wherein the third doped region of the ending diode structure is coupled to a ground terminal and the second doped region of the ending diode structure is coupled to the third doped region of one of the additional diode structures immediately before the ending diode structure in the diode string.

5. The diode string structure of claim 1, wherein the first conductive type is a p-doped type and the second conductive type is an n-doped type, or the first conductive type is an n-doped type and the second conductive type is a p-doped type.

* * * * *